United States Patent
Jamée

[11] 3,980,903
[45] Sept. 14, 1976

[54] OPTICAL-ELECTRONIC RELAY

[75] Inventor: Jean Jamée, Paris, France

[73] Assignee: Thomson-CSF, Paris, France

[22] Filed: Mar. 25, 1975

[21] Appl. No.: 561,870

[30] Foreign Application Priority Data
Mar. 29, 1974 France .......................... 74.11329

[52] U.S. Cl. ............................ 307/311; 307/254; 307/255
[51] Int. Cl.² ........................................... H03K 17/00
[58] Field of Search .................. 307/311, 254, 255; 330/60; 250/562; 317/124

[56] References Cited
UNITED STATES PATENTS

| | | | |
|---|---|---|---|
| 3,693,027 | 9/1971 | Garaway | 307/311 UX |
| 3,813,539 | 5/1974 | Sioma | 307/311 X |
| 3,818,235 | 6/1974 | Johnson et al. | 307/311 |

*Primary Examiner*—Stanley D. Miller, Jr.
*Assistant Examiner*—B. P. Davis
*Attorney, Agent, or Firm*—Cushman, Darby & Cushman

[57] ABSTRACT

A relay controlled by light radiation ensuring electrical insulation between the control circuit and the controlled circuit, comprising a transistor T connected across terminals of the circuit (S,R) and controlled by a signal coming from the phototransistor (PT). The protection of this phototransistor against the voltage differences appearing across the terminals (1) (1'), depending upon whether the circuit is open or closed, is provided by a constant current supply circuit incorporating a transistor (T') controlled by a signal created across the terminals of a resistor (22).

6 Claims, 3 Drawing Figures

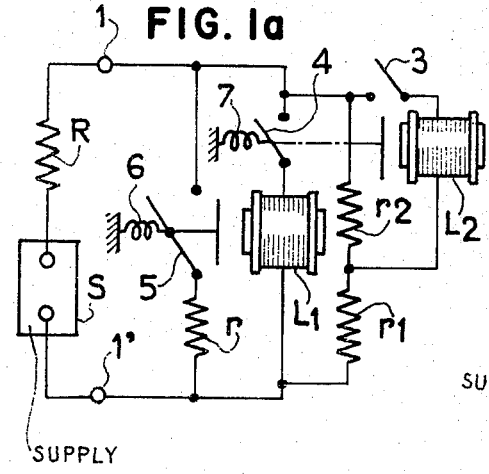
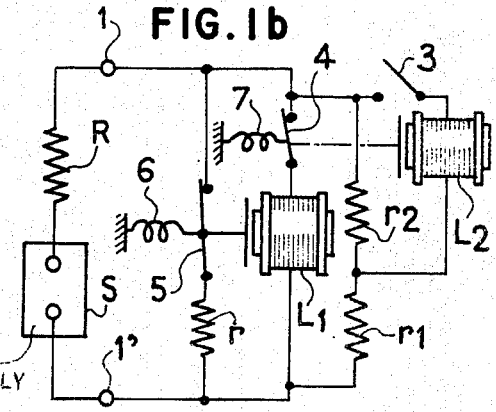
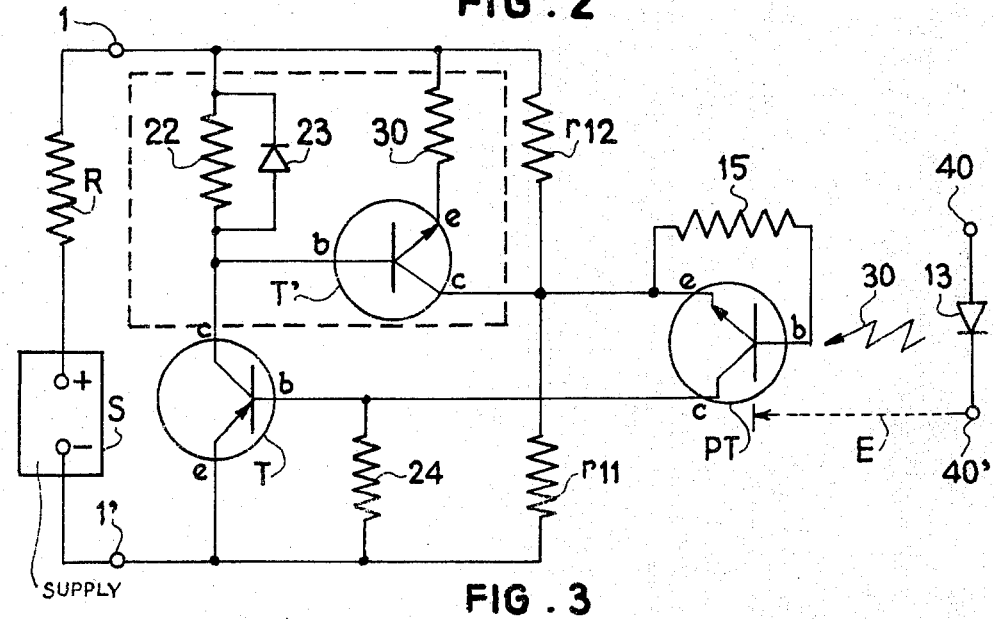
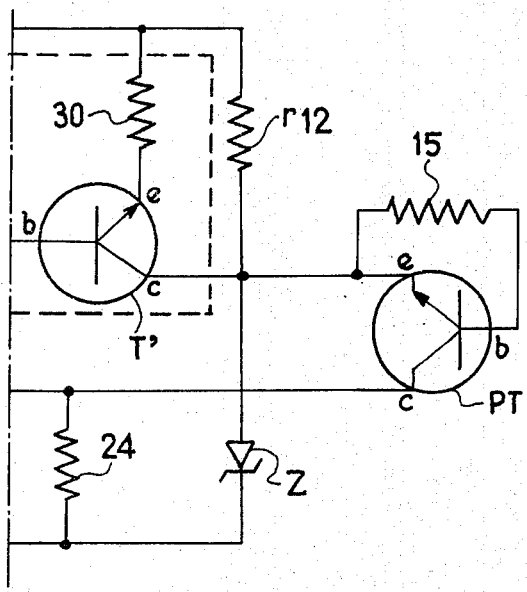

OPTICAL-ELECTRONIC RELAY

The present invention relates to the fields of electrical relays and, more particularly, to telegraphic relays.

This kind of device, which is responsible for closing and opening an electrical circuit in which it is included, by the application of an electrical control signal to one of its elements doing duty as a contact breaker, is required in operation to have high speeds of opening and closing so that telegraphic transmission at high information densities is possible, under the simplest possible conditions of installation and operation.

However, telegraphic relays of known kind all exhibit drawbacks, where the compliance with certain of these requirements is concerned.

Electromechanical relays whose contact breakers contain moving contact elements driven by an electromagnet, have the drawback that the service life of these contact elements is limited so that numerous readjustments during the operation of the device are required and, furthermore, rebound phenomena occur in these contact elements. The telegraphy signal transmission speeds which they can handle are limited to 100 bauds.

Mercury-wetted contact types of relays in a sealed vessel make it possible to increase the transmission speed to 200 bauds but require determinate orientation in relation to the gravitational force, and this constitutes a limitation where the free design and installation of the equipment is concerned.

Finally, static relays, whose telegraphy transmission speed can substantially exceed 1000 bauds, usually have the drawback that they provide no electrical insulation between the control circuit and the controlled circuit.

The telegraphic relay in accordance with the present invention is not open to these drawbacks. This is a relay of the static, semi-conductor type, where total electrical insulation has been effected by the creation of a geometrical interval between the control circuit and the controlled circuit, the transmission of the control signal to the contact breaker device being effected across said space by means of electromagnetic radiation, and thus without any electrical contact.

The telegraphic relay of the invention, accordingly, incorporates a device emitting this kind of radiation, which is connected to the output terminal of its control circuit, and a corresponding receiver device connected to the input terminals of the contact breaker device.

In one typical embodiment of the invention, the wavelength of the radiation is chosen to fall within a range comprising the visible spectrum, in respect of which it is possible to design the transmitter and the receiver which the relay of the invention comprises, in a straightforward manner and using semi-conductor materials. However, the simple insertion of an optical intermediate transmission device in a relay, would, as will be explained in detail hereinafter, lead, by virtue of the method of its supply with electrical energy which is taken from the control circuit, to wide fluctuations in the voltage or the current, in a way which would seriously prejudice the operation of this optical device. It is for that reason that, in accordance with the invention circuit, elements are associated with the contact breaker device in order to compensate for these variations, in the respective "open" and "closed" states of the contact breaker, thus ensuring optimum operation of the optical device.

More specifically, the invention consists of an optical-electronic relay, comprising a principal transistor (T) which, in an electrical circuit, by opening or closing thereof, through the action of an electrical signal applied to its base, enables a current to flow or interrupts such current, said circuit having two terminals, the first connected to the emitter and the second, across a resistor, to the collector of said transistor, and comprising at least one electrical energy source (S) and a load (R) connected in series, wherein said electrical signal is created, under the action of an electromagnetic radiation source 13, by a phototransistor (PT) arranged opposite said source, said phototransistor having its collector connected to the common point of a divider bridge connected between said two terminals, and constituted by two resistive elements arranged in series, the resistance of at least one of said elements being variable and being controlled by said current, so achieving, in respect of said opening and closing operations, a constant current through the phototransistor.

The invention will be better understood from a consideration of the ensuing description and reference to the attached drawings where:

FIG. 1 illustrates, in the form of an explanatory diagram, the relay in accordance with a prior art embodiment;

FIG. 2 illustrates a first embodiment of the relay in accordance with the invention;

FIG. 3 illustrates another embodiment.

FIG. 1 illustrates, in the form of an explanatory diagram, a circuit comprising an electromechanical relay, operating in accordance with a known principle, shown here by way of example.

The circuit is constituted by a direct voltage source S connected in series with a resistor R representing the load into which the source injects, and a relay connected across the terminals 1, 1' of the assembly of S and R. The relay incorporates a contact breaker 5 driven by the electromagnet with its coil $L_1$, and a control device constituted by the contact breaker 4, driven by an electromagnet with its coil $L_2$. The coils $L_1$, $L_2$ are connected to the terminals 1, 1' the coil $L_1$ directly, and the other coil $L_2$ across a divider bridge constituted by two resistors $r_1$ and $r_2$, and a primary contact breaker 3.

The operation of this kind of relay can be broken down into two phases, described hereinafter, corresponding respectively to the two cases in which the contact breaker 5 is open, and in which it is closed.

In the case shown at (a) in FIG. 1, being that where the controlled circuit is open, the primary contact breaker 3 is open, the coil $L_2$ carrying no current, the control contact breaker 4 is open and, since the coil $L_1$ carries no current either, the main contact breaker 5 is open.

Under these conditions, the whole of the source voltage is applied to the divider bridge ($r_1$, $r_2$) connected to the terminals 1, 1' across the load resistor R; in order, advantageously, to arrange that the source S only delivers a very light current, in fact that drawn by the divider bridge ($r_1$, $r_2$), it is necessary to give these resistors resistances which are high compared with that of R.

The case shown in (b) in FIG. 1 is that in which the controlled circuit is closed. The contact breakers 3, 4 and 5 are then closed and the working current then circulates through the controlled circuit constituted by the closed loop incorporating the resistor R, the contact breaker 5 and the resistor R arranged in series with the latter, the function of which resistor will be explained at this juncture: in fact, due to the closing of the main contact breaker 5, the potential difference between the terminals 1 and 1' is then zero; and under these conditions, the coils $L_1$ and $L_2$ connected to them cease to carry any voltage, so that the contact breakers 4 and 5 open, under the action of their opening devices 6 and 7. It is therefore essential, during the closure of the contact breaker 3, to maintain an adequate potential difference between the terminals 1 or 1', to insure that through the coils $L_1$ and $L_2$ there circulate the requisite currents for the closure of the contact breakers 4 and 5; this is the function of the resistor r, connected in series in the controlled circuit, with the main contact breaker 5, and whose resistance will advantageously be low compared with that of the load resistor R, albeit nevertheless sufficient in order, as indicated earlier, to produce a voltage drop sufficient to ensure closing of the contact breakers 4 and 5.

In practice, the orders of magnitude of the resistances of r, $r_1$ and $r_2$ in relation to the resistance of the load resistor R, always, in the aim to achieve a low electrical power consumption by these auxiliary resistors, lead to wide fluctuations in voltage and consequently in current, across the terminals of the coil $L_2$; the characteristics of this coil must therefore be designed to ensure operation of the control contact breaker 4 under the action of the high voltage corresponding to the open-circuit condition, whilst ensuring that this same contact breaker is maintained closed under the action of the low voltage which occurs in the closed-circuit condition.

The simple and robust structure of an electromagnet coil such as that $L_2$, generally makes it capable of withstanding such variations in voltage and current.

FIG. 2 schematically illustrates a first embodiment of the telegraphic relay in accordance with the invention, where the functions of the contact breaker elements of the relay shown in FIG. 1 are performed by elements made of semiconductor material and comprising devices of known kind such as transistors and diodes. These devices, operating without any mechanical or moving parts, are responsible for the description of the relay in which they are incorporated, as a static relay.

FIG. 2, on the other hand, illustrates the same elements as FIG. 1 in the working circuit, these elements carrying the same references, namely the source S and its load resistor R connected in series across the terminals 1 and 1'.

In accordance with the invention, the relay exhibits perfect electrical isolation between the primary control circuit and the controlled circuit, thanks to the structure which is now described:
the control circuit is constituted by a photo-emissive diode 13 emitting electromagnetic radiation 30, under the action of a voltage applied to its terminals 40 and 40'. The wavelength of the radiation can be chosen, for example, within the visible spectrum, but can be chosen also in the infra-red or in the ultra-violet band of the spectrum.

Opposite said diode, at a distance E therefrom, there is arranged a device designed to act as a receiver for this radiation, which device, in the field of semi-conductors, is referred to as a phototransistor.

The base of the phototransistor PT receives the control radiation, and is electrically biased by the resistor 15 connected to its emitter; this emitter is biased by a divider bridge constituted by two resistors $r_{11}$ and $r_{12}$, connected between the terminals 1 and 1' of the controlled circuit.

The collector C of PT feeds the base B, biased by the resistor 24, of the main transistor T which is responsible for the contact breaker function in the working circuit, and whose collector and emitter are connected to the terminals 1 and 1' of said circuit, across a resistor 22, having a diode 23 shunted across it, the function of which will be explained later on.

Finally, shunted across the resistor $r_{12}$ and connected there by its emitter and collector terminals, there is a transistor I', whose base is connected to the collector of the main transistor T.

The operation of this kind of relay can be compared with that of the relay shown in FIG. 1, where the function of the main contact breaker 5 and its coil $L_1$ is performed by the main transistor T, the function of the control contact breaker 4 and its coil $L_2$ being performed by the transistor PT and the function of the primary contact breaker being performed by the photoemissive diode 13. The operation of the relay in accordance with the invention, however, differs fundamentally, by virtue of the difference in nature between electromechanical relays and semi-conductor devices which latter involve the introduction of additional elements, such as the transistor T' and its associated circuit, these having been surrounded by a broken-line box in FIG. 2 in order to clarify matters.

The operation of the optical-electronic relay in accordance with the invention can be broken down, as follows, into two phases corresponding to the two cases in which the transistor T is respectively non-conductive and conductive.

In the first case, where the transistor T is non-conductive, the working circuit (S, R) is open, and the whole of the source voltage is applied across the divider bridge ($r_{11}$, $r_{12}$) and the resistor 24, between the emitter and the collector of the transistor PT.

This type of transistor, as the prior art demonstrates, unlike the contact breaker 4, $L_2$ of FIG. 1, can only carry a fraction of the voltage conventionally applied to the working circuit, so that by a suitable choice of the resistors $r_{11}$ and $r_{12}$, the bridge has to be given a high division ratio. On the other hand, the fact that the divider bridge is connected across the terminals 1, 1' of the working circuit, to which latter, in the open-circuit condition, the whole of the voltage of the source S is applied, means that these resistors have to be given high absolute resistances compared with that of the load resistor R, in order to reduce the power consumption of the bridge in the open-circuit condition.

The phototransitor is thus supplied permanently and completely safely.

During the second phase, in which the relay becomes conductive, the source 13 emits radiation through the application of a voltage across the terminals 40, 40', which radiation causes conduction through the emitter-collector interval of the phototransistor PT. The resulting signal is applied to the base of the main transistor T which becomes conductive, and the controlled circuit (S, R) is thus rendered operative.

Under these conditions, and as already explained in the case of the device shown in FIG. 1, the voltage across the terminals 1, 1' becomes substantially zero and is reduced to the ohmic voltage drop caused by the internal resistance of the main transistor T.

In typical cases given by way of example, the voltage across the terminals 1, 1' thus changes from 48 volts in the open-circuit condition to 2 volts in the closed-circuit condition.

But the voltage across the terminals 1, 1' is used to supply the control transistor PT; and, at the low voltage value corresponding to the second phase, and applied moreover to a divider bridge designed for the high voltage which occurs in the first phase, ceases to operate, so that the transistor T, whose conduction state it is controlling, blocks.

It is therefore necessary, in operation, to modify the division ratio of the bridge ($r_{11}$, $r_{12}$) depending upon which of the states the controlled circuit (S, R) is placed in.

In accordance with the invention, this modification is achieved by the use of a variable resistor connected in parallel across one of the resistors of the divider bridge, the resistor $r_{12}$ in the case shown in FIG. 2. This variable resistor is constituted by a transistor T' whose emitter-collector current is controlled, through the medium of its base, by the current flowing through the main transistor T.

The operation of the transistor T' is as follows: in the non-conductive phase of the transistor T, no current flows through the resistor 22, no potential difference appears across the terminals of this resistor, and the transistor T', whose base is connected to it, is not conductive.

The divider bridge ($r_{11}$, $r_{12}$) is then in its high division ratio condition, and the transistor PT is protected against the high voltage existing across the terminals 1, 1'.

In the conductive phase of the transistor T, the resistor 22 causes a voltage drop which is applied to the base of the transistor T', the latter then going conductive. The divider bridge ($r_{11}$, $r_{12}$) then changes to its lower division ratio condition, and the transistor PT is supplied with an adequate voltage derived from the reduced voltage appearing across the terminals 1, 1'.

The diode 23, shunted across the resistor 24, makes it possible, depending upon the value of the current flowing through T, to limit the base current of the transistor T' driving it conductive.

It makes it possible, on the other hand, through its characteristics of conduction as a function of temperature variations, to compensate for those of the transistor T' which experiences the same variations.

Thus, the assembly of circuits shown in the broken-line box ensures, in association with the resistors used to supply and bias the phototransistor PT, substantially constant supply conditions at the terminals of this transistor.

FIG. 3 illustrates a variant embodiment of the relay in accordance with the invention.

In this variant embodiment, where, to simplify matters, only that part of the relay circuit in which the modification is incorporated, has been shown, namely the circuit section containing the phototransistor PT and the transistor T', one of the two resistors of the divider bridge ($r_{11}$, $r_{12}$) has been replaced by a resistive element whose resistance is variable as a function of the voltage, as for example a zener diode. The replacement of the resistor $r_{11}$ by a zener diode connected in the reverse direction to the emitter of the transistor PT, yields the advantage of higher stability in the supply voltage to the transistor PT, in association with a very low electrical power consumption in the thus modified divider bridge.

The operation of this part of the relay is then as follows: when the transistor T is non-conductive, the whole of the source voltage is applied across the bridge ($r_{12}$, Z) and the zener diode Z conducts. The divider bridge then has a high division ratio and the phototransistor PT only passes a small fraction of the current flowing through the divider bridge.

When the transistor T is conductive, the zener diode is in its non-conducting voltage range, the division ratio of the divider bridge ($r_{12}$, Z) then being very low, and the whole of the current furnished by the transistor T' is able to flow across the photo-transistor PT to ensure that the transistor T is maintained in the conductive condition.

The static optical-electronic relay in accordance with the invention lends itself advantageously to an integrated monolithic embodiment in the form of integrated circuits.

Of course, the invention is not limited to the embodiments described and shown, which were given solely by way of example.

What is claimed is:

1. An optical-electronic relay comprising a main transistor (T), having three electrodes, respectively an emitter, a base and a collector, which, in an electrical circuit, by opening or closing thereof, through the action of an electrical signal applied to its base, enables a current to flow, or interrupts such current, said circuit having two terminals, the first connected to the emitter and the second, across a resistor, to the collector of said transistor, and comprising at least one electrical energy source (S) and a load (R) connected in series, said electrical signal being created, under the action of an electromagnetic radiation source (13), by a phototransistor (PT) arranged opposite said source, wherein said phototransistor having its collector connected to the common point of a divider bridge connected between said two terminals, and constituted by two resistive elements arranged in series, the resistance of at least one of said elements being variable, and being controlled by said current, so achieving safely, in respect of said opening and closing operations, a constant current through the phototransistor.

2. An optical-electronic relay as claim in claim 1, wherein said element exhibiting variable resistance is constituted by a second resistor and a second transistor connected in parallel, the emitter of said second transistor, being connected across an emitter resistor to that end of said second resistor which is connected to said second terminal, the collector being connected to the other end of said second resistor, and the base being connected to the collector of the main transistor.

3. An optical-electronic relay as claimed in claim 2, wherein a diode is connected in parallel across said collector resistor of the main transistor.

4. An optical-electronic relay as claimed in claim 2, wherein the other of said variable-resistance elements is constituted by a zener diode.

5. An optical-electronic relay as claimed in claim 1, wherein the wavelength of said radiation is located in the visible range.

6. An optical-electronic relay as claimed in claim 1, wherein the wavelength of said radiation is located in the infra-red range.

* * * * *